United States Patent
Sato

(10) Patent No.: US 11,145,913 B2
(45) Date of Patent: Oct. 12, 2021

(54) CONTACT FUNCTION-EQUIPPED MULTICHANNEL CHARGE/DISCHARGE POWER SUPPLY WITH VOLTAGE MEASUREMENT

(71) Applicant: SoftEnergy Controls Inc., Kitakyushu (JP)

(72) Inventor: Yuji Sato, Kitakyushu (JP)

(73) Assignee: SOFTENERGY CONTROLS INC., Kitakyushu (JP)

( * ) Notice: Subject to any disclaimer, the term of this patent is extended or adjusted under 35 U.S.C. 154(b) by 0 days.

(21) Appl. No.: 16/617,149

(22) PCT Filed: Aug. 30, 2018

(86) PCT No.: PCT/JP2018/032200
§ 371 (c)(1),
(2) Date: Nov. 26, 2019

(87) PCT Pub. No.: WO2019/045003
PCT Pub. Date: Mar. 7, 2019

(65) Prior Publication Data
US 2020/0112070 A1    Apr. 9, 2020

(30) Foreign Application Priority Data

Aug. 31, 2017    (JP) .............................. JP2017-167181

(51) Int. Cl.
*H02J 7/00* (2006.01)
*H01M 10/48* (2006.01)
(Continued)

(52) U.S. Cl.
CPC ...... *H01M 10/482* (2013.01); *G01R 31/3644* (2013.01); *G01R 31/3835* (2019.01);
(Continued)

(58) Field of Classification Search
CPC ............. H01M 10/482; H01M 10/441; H01M 10/425; G01R 31/3835; G01R 31/3644;
(Continued)

(56) References Cited

U.S. PATENT DOCUMENTS

| 5,204,609 A | * | 4/1993 | Alisauski | ............ H01M 10/613 320/107 |
| 5,490,572 A | * | 2/1996 | Tajiri | ................. B60H 1/00392 180/65.1 |

(Continued)

FOREIGN PATENT DOCUMENTS

| CN | 202614911 U | 12/2012 |
| CN | 105098889 A | 11/2015 |

(Continued)

OTHER PUBLICATIONS

International Search Report dated Sep. 25, 2018, issued in counterpart International Application No. PCT/JP2018/032200 (2 pages).

(Continued)

*Primary Examiner* — John T Trischler
(74) *Attorney, Agent, or Firm* — Westerman, Hattori, Daniels & Adrian, LLP

(57) ABSTRACT

A contact function-equipped multichannel charge/discharge power supply has: first and second charge/discharge probes respectively connected to positive and negative electrodes of secondary batteries and first and second voltage-measurement probes, respectively connected to the positive and negative electrodes of the batteries; and charge/discharge means each provided for each of the batteries and each connected to a pair of the first and second charge/discharge probes. The power supply includes: trays each having a right-angled-quadrilateral shape in plan view, in which the batteries are arranged longitudinally and laterally at predetermined intervals; and substrates each having the charge/discharge means provided along the batteries arranged in (Continued)

each line in one direction, wherein the substrates are each provided with the first and/or second charge/discharge probes corresponding to the batteries arranged in each line in the one direction.

4 Claims, 5 Drawing Sheets

(51) Int. Cl.
*G01R 31/3835* (2019.01)
*G01R 31/36* (2020.01)
*H01M 10/44* (2006.01)

(52) U.S. Cl.
CPC ......... *H01M 10/441* (2013.01); *H02J 7/0013* (2013.01); *H02J 7/0047* (2013.01)

(58) Field of Classification Search
CPC .. G01R 31/3865; H02J 7/0013; H02J 7/0047; H02J 7/0045
USPC .......................................................... 320/107
See application file for complete search history.

(56) References Cited

U.S. PATENT DOCUMENTS

| | | | | |
|---|---|---|---|---|
| 5,592,065 | A * | 1/1997 | Oglesbee | H02J 7/0091 320/113 |
| 5,982,140 | A * | 11/1999 | Toya | H02J 7/0045 320/107 |
| 6,111,387 | A * | 8/2000 | Kouzu | H01M 10/613 320/107 |
| 6,211,645 | B1 * | 4/2001 | Kouzu | H01M 2/1072 320/107 |
| 6,211,646 | B1 * | 4/2001 | Kouzu | H01M 2/1072 320/107 |
| 6,225,788 | B1 * | 5/2001 | Kouzu | H01M 10/46 320/150 |
| 6,344,728 | B1 * | 2/2002 | Kouzu | H01M 10/6563 320/116 |
| 6,411,063 | B1 * | 6/2002 | Kouzu | H01M 10/613 320/150 |
| 6,498,406 | B1 * | 12/2002 | Horiuchi | H01M 10/6566 307/150 |
| 6,838,923 | B2 * | 1/2005 | Pearson | H01M 8/04888 327/309 |
| 7,014,949 | B2 * | 3/2006 | Kanai | H01M 10/6563 429/148 |
| 7,187,156 | B2 * | 3/2007 | Nakasho | H02J 7/0045 320/107 |
| 7,304,453 | B2 * | 12/2007 | Eaves | G01T 1/2018 320/107 |
| 7,656,126 | B2 * | 2/2010 | Sato | H02J 7/0014 320/134 |
| 8,058,842 | B2 * | 11/2011 | Kai | H01M 2/1077 320/116 |
| 8,136,454 | B2 * | 3/2012 | Barbee | B61C 3/02 105/50 |
| 8,154,258 | B2 * | 4/2012 | Pappas | H01G 9/155 320/166 |
| 8,207,704 | B2 * | 6/2012 | Kai | H01M 10/486 320/116 |
| 8,299,801 | B2 * | 10/2012 | Yano | H01M 2/1252 324/427 |
| 8,310,094 | B2 * | 11/2012 | Yamada | H02J 3/381 307/46 |
| 8,342,103 | B2 * | 1/2013 | Barbee | B60L 58/22 105/50 |
| 8,353,374 | B2 * | 1/2013 | Sugawara | B60L 58/26 180/65.1 |
| 8,482,262 | B2 * | 7/2013 | Takami | B60L 53/11 320/148 |
| 8,643,341 | B2 * | 2/2014 | Hamaguchi | H01M 10/625 320/150 |
| 8,813,866 | B2 * | 8/2014 | Suzuki | H02J 7/0021 173/2 |
| 8,830,676 | B2 * | 9/2014 | Borck | H01M 10/443 361/688 |
| 8,962,172 | B2 * | 2/2015 | Bolze | H01M 10/6554 429/120 |
| 8,981,917 | B2 * | 3/2015 | Hiramatsu | H02J 9/06 340/436 |
| 8,984,711 | B2 * | 3/2015 | Ota | B25F 5/00 15/339 |
| 9,024,572 | B2 * | 5/2015 | Nishihara | H01M 10/441 320/107 |
| 9,041,403 | B2 * | 5/2015 | Aoki | H01M 10/482 324/426 |
| 9,164,149 | B2 * | 10/2015 | Dewa | G01R 1/06744 |
| 9,276,418 | B2 * | 3/2016 | Kawasaki | H02J 7/0027 |
| 9,381,825 | B2 * | 7/2016 | Li | H02J 7/0019 |
| 9,444,086 | B2 * | 9/2016 | Shimizu | H01M 2/204 |
| 9,466,861 | B2 * | 10/2016 | Harii | H01M 10/6563 |
| 9,550,425 | B2 * | 1/2017 | Sugawara | B60L 11/1811 |
| 9,583,746 | B2 * | 2/2017 | Ota | H01M 10/488 |
| 9,583,793 | B2 * | 2/2017 | White | H01M 10/445 |
| 9,705,161 | B2 * | 7/2017 | Nishihara | B60L 50/60 |
| 9,728,822 | B2 * | 8/2017 | Taga | H01M 10/46 |
| 9,768,612 | B2 * | 9/2017 | Iwasaki | H02J 3/32 |
| 9,847,559 | B2 * | 12/2017 | Niwa | H01M 10/482 |
| 10,103,367 | B2 * | 10/2018 | DeKeuster | H02J 7/0069 |
| 10,153,651 | B2 * | 12/2018 | Taylor | H02J 7/0029 |
| 10,181,740 | B2 * | 1/2019 | Tanaka | B60L 15/20 |
| 10,389,142 | B2 * | 8/2019 | Sugeno | B60L 53/665 |
| 10,446,890 | B2 * | 10/2019 | Yoshida | H01M 10/643 |
| 10,559,789 | B2 * | 2/2020 | Ota | H02J 7/0021 |
| 10,601,239 | B2 * | 3/2020 | Taylor | H01M 10/446 |
| 10,615,465 | B2 * | 4/2020 | Huff | H01M 2/1077 |
| 10,753,984 | B2 * | 8/2020 | Schaefer | G01R 27/2605 |
| 10,804,661 | B1 * | 10/2020 | Burke | H02J 7/0013 |
| 2004/0228055 | A1 * | 11/2004 | Pearson | H01M 16/006 361/93.1 |
| 2006/0068272 | A1 * | 3/2006 | Takami | B60L 7/14 429/62 |
| 2007/0122692 | A1 * | 5/2007 | Smith | H01M 10/643 429/87 |
| 2007/0164710 | A1 * | 7/2007 | Sato | H02J 7/0014 320/134 |
| 2008/0050645 | A1 * | 2/2008 | Kai | B60L 50/64 429/61 |
| 2008/0280192 | A1 * | 11/2008 | Drozdz | H01M 10/6571 429/62 |
| 2008/0290836 | A1 * | 11/2008 | Tsai | H02J 7/0042 320/114 |
| 2009/0087722 | A1 * | 4/2009 | Sakabe | B60L 58/22 429/61 |
| 2009/0134839 | A1 * | 5/2009 | Lin | H02J 7/0045 320/110 |
| 2009/0302681 | A1 * | 12/2009 | Yamada | H02J 3/386 307/46 |
| 2010/0116570 | A1 * | 5/2010 | Sugawara | H01M 10/6563 180/65.1 |
| 2010/0201326 | A1 * | 8/2010 | Takami | H01M 10/6563 320/152 |
| 2010/0275810 | A1 * | 11/2010 | Barbee | B60L 7/24 105/50 |
| 2011/0076521 | A1 * | 3/2011 | Shimizu | H01M 2/26 429/7 |
| 2011/0181233 | A1 * | 7/2011 | Mino | H02J 7/35 320/101 |
| 2011/0197389 | A1 * | 8/2011 | Ota | H02J 7/00309 15/339 |
| 2011/0198103 | A1 * | 8/2011 | Suzuki | B25F 5/00 173/46 |
| 2011/0206948 | A1 * | 8/2011 | Asai | H01M 10/652 429/7 |
| 2011/0248719 | A1 * | 10/2011 | Aoki | H01M 10/482 324/426 |

(56) References Cited

U.S. PATENT DOCUMENTS

| | | | | |
|---|---|---|---|---|
| 2011/0291622 A1* | 12/2011 | Hamaguchi | H01M 10/486 | 320/150 |
| 2011/0313613 A1* | 12/2011 | Kawahara | B60L 50/61 | 701/34.4 |
| 2012/0019061 A1* | 1/2012 | Nishihara | H01M 10/441 | 307/10.1 |
| 2012/0052345 A1* | 3/2012 | Kai | B60L 58/22 | 429/61 |
| 2012/0160124 A1* | 6/2012 | Barbee | B60L 58/22 | 105/35 |
| 2012/0161677 A1* | 6/2012 | Kunimitsu | B60L 58/22 | 318/139 |
| 2012/0286706 A1* | 11/2012 | Ohkura | B60L 58/19 | 318/139 |
| 2013/0063073 A1* | 3/2013 | Kawasaki | H02J 7/0027 | 320/101 |
| 2013/0106594 A1* | 5/2013 | Hiramatsu | H02J 9/06 | 340/436 |
| 2013/0164579 A1* | 6/2013 | Harii | H01M 10/617 | 429/82 |
| 2013/0164589 A1* | 6/2013 | Ota | H01M 2/10 | 429/99 |
| 2013/0177791 A1* | 7/2013 | Takahashi | H01M 10/633 | 429/72 |
| 2013/0193768 A1* | 8/2013 | Iwasaki | H02J 7/35 | 307/85 |
| 2013/0200700 A1* | 8/2013 | Ohkura | H01M 10/482 | 307/10.7 |
| 2013/0235526 A1* | 9/2013 | Watanabe | B60L 50/15 | 361/699 |
| 2013/0257371 A1* | 10/2013 | Komai | H02J 50/80 | 320/108 |
| 2014/0017533 A1* | 1/2014 | Nishihara | H01M 10/482 | 429/93 |
| 2014/0320108 A1* | 10/2014 | Dewa | G01R 1/06744 | 324/72.5 |
| 2015/0061571 A1* | 3/2015 | Lin | H02J 7/0044 | 320/107 |
| 2015/0164138 A1* | 6/2015 | Liu | A24F 47/008 | 206/268 |
| 2015/0231985 A1* | 8/2015 | Li | G01R 31/382 | 320/134 |
| 2015/0236529 A1* | 8/2015 | Tanaka | B60L 15/2009 | 320/109 |
| 2015/0244034 A1* | 8/2015 | Taga | H01M 10/42 | 320/107 |
| 2015/0291045 A1* | 10/2015 | Sugawara | H01M 10/48 | 318/139 |
| 2015/0333301 A1* | 11/2015 | Ota | H02J 7/00309 | 15/405 |
| 2015/0357692 A1* | 12/2015 | Piggott | H02J 7/0068 | 320/107 |
| 2016/0079635 A1* | 3/2016 | Niwa | H01M 10/482 | 324/426 |
| 2016/0093852 A1* | 3/2016 | DeKeuster | H02J 7/0069 | 320/107 |
| 2016/0105042 A1* | 4/2016 | Taylor | H02J 7/0047 | 320/134 |
| 2017/0008417 A1* | 1/2017 | Yoshida | H01M 10/482 | |
| 2017/0125754 A1* | 5/2017 | Ota | H02J 7/00309 | |
| 2017/0207637 A1* | 7/2017 | Sugeno | H02J 7/0013 | |
| 2018/0278071 A1* | 9/2018 | Murakami | H01M 10/443 | |
| 2019/0319460 A1* | 10/2019 | Taylor | H01M 10/46 | |
| 2019/0372365 A1* | 12/2019 | Qin | H02J 7/00309 | |
| 2020/0127251 A1* | 4/2020 | Ota | H01M 2/34 | |

FOREIGN PATENT DOCUMENTS

| | | |
|---|---|---|
| JP | 2011-146372 A | 7/2011 |
| JP | 2012-244742 A | 12/2012 |
| JP | 2013-145131 A | 7/2013 |
| JP | 2013-164297 A | 8/2013 |
| JP | 2013-229201 A | 11/2013 |
| KR | 10-2013-0093020 A | 8/2013 |
| KR | 10-2013-0108610 A | 10/2013 |
| KR | 10-2016-0007043 A | 1/2016 |
| TW | 201236311 A | 9/2012 |
| TW | 201624817 A | 7/2016 |

OTHER PUBLICATIONS

Notification of Reasons for Refusal dated Sep. 25, 2018, issued in counterpart of JP Patent Application No. 2017-167181 with English Translation (8 pages).

Decision to Grant a Patent dated Dec. 18, 2018, issued in counterpart of Japanese Patent Application No. 2017-167181 with English Translation (5 pages).

Written Decision on Registration dated Apr. 24, 2020, issued in counterpart KR Application No. 10-2019-7034439, with English translation (2 pages).

Office Action dated Nov. 1, 2019, issued in counterpart TW Application No. 108102413, with English translation (8 pages).

Office Action dated Dec. 19, 2019, issued in counterpart KR Application No. 10-2019-7034439, with English translation (9 pages).

Office Action dated Mar. 22, 2021, issued in counterpart CN application No. 201880034209.6, with English translation. (13 pages).

* cited by examiner

CONTACT FUNCTION-EQUIPPED MULTICHANNEL CHARGE/DISCHARGE POWER SUPPLY WITH VOLTAGE MEASUREMENT

TECHNICAL FIELD

The present invention is related to a contact function-equipped multichannel charge/discharge power supply for performing charge/discharge tests of secondary batteries (i.e. a charge/discharge test apparatus for secondary batteries).

BACKGROUND ART

Today, the demand for secondary batteries used for IT appliances such as smart-phones or else and electric cars has been rapidly increasing.

In a last process during the mass production of the secondary batteries, a charge/discharge evaluation apparatus (a charge/discharge test apparatus) that performs activations and quality inspections of the produced secondary batteries is vastly used.

The charge/discharge evaluation apparatus vastly used currently is, as illustrated in FIG. 5, composed of a power supply unit 90 and a contact unit 92 (including a probe unit for positive electrodes 93 and a probe unit for negative electrodes 94) that are separately independent. The contact unit 92 is connected to secondary batteries 91 that are test objects, and cables 95 are used to connect the power supply unit 90 and the contact unit 92 (e.g. see Patent Literature 1, 2). Incidentally, the secondary batteries 91 shown in FIG. 5 are also plurally arranged in lines in the depth direction of FIG. 5. The number: m of the secondary batteries 91 is larger than the number: n of a plurality of charge/discharge power supplies 96 (charge/discharge means) composing the power supply unit 90 (e.g. more than tenfold) (e.g. n<m).

CITATION LIST

Patent Literature

Patent Literature 1: Japanese Unexamined Patent Application Publication No. 2013-229201
Patent Literature 2: Japanese Unexamined Patent Application Publication No. 2011-146372

SUMMARY OF INVENTION

Technical Problem

However, as described above, the cables 95 are used in the charge/discharge evaluation apparatus to connect the power supply unit 90 and the contact unit 92. This leads to adverse effects such as the heat generated by the cables 95, and influences of noises caused by pulling around the cables 95.

Also, to keep maintainability, output from the power supply unit 90 and the probe units 93, 94 is performed from only one direction using output terminals or connecters, and thus, impedances are different depending on charge/discharge channels (i.e. code groups to be each connected to each of the secondary batteries 91). In order to resolve it, the lengths of the cables 95 are made to be changed (e.g. made to be longer) to equalize the impedances. As a result, the lengths of the cables 95 have to be made longer than necessity, and there have been problems such as deteriorations of efficiency caused by the heat generated by the cables 95, and temperature and noise influences to the secondary batteries.

Furthermore, in the conventional technique where the power supply unit 90 and the contact unit 92 are separately disposed and connected by using the cables 95, the more the number of the charge/discharge channels increases, the more complicating the wiring of the cables 95 gets. This leads to an increase in maintenance costs and larger errors in test results.

Moreover, since a ready-made product is used for the power supply unit 90, there is a limit to making more compact the entire apparatus including the power supply unit 90, the cables 95, and the probe units 93, 94.

The present invention has been made in consideration of the above circumstances, and has as its object to provide a contact function-equipped multichannel charge/discharge power supply that enables to, by eliminating or extremely shortening the cables that have been conventionally used for connecting the power supply unit and the contact unit, obtain good test results, resolve the adverse effects caused by using the cables, and additionally, make the apparatus structure more compact.

Solution to Problem

In order to achieve the above object, a contact function-equipped multichannel charge/discharge power supply according to the present invention has: first and second charge/discharge probes respectively connected to positive and negative electrodes of a plurality of secondary batteries and first and second voltage-measurement probes respectively connected to the positive and negative electrodes of the secondary batteries; and charge/discharge means each provided for each of the secondary batteries, each of the charge/discharge means being connected to a pair of the first and second charge/discharge probes, and the contact function-equipped multichannel charge/discharge power supply comprises:

trays each having a right-angled-quadrilateral shape in plan view, in each of the trays the secondary batteries being arranged longitudinally and laterally at predetermined intervals; and substrates provided along the secondary batteries arranged in lines in one direction (one of the longitudinal and lateral directions), the substrates having the charge/discharge means corresponding to the secondary batteries arranged in the lines in the one direction, wherein each of the substrates is provided with the first and/or second charge/discharge probes corresponding to the secondary batteries arranged in the lines in the one direction.

Note that a plurality of the secondary batteries are carried into the contact function-equipped multichannel charge/discharge power supply with: the first and second charge/discharge probes respectively connected to the positive and negative electrodes of a plurality of the secondary batteries and the first and second voltage-measurement probes respectively connected to the positive and negative electrodes of the secondary batteries; and the charge/discharge means each provided for each of the secondary batteries, each of the charge/discharge means being connected to a pair of the first and second charge/discharge probes, in a state where the secondary batteries are arranged in lines at regular intervals in each of the trays, and it is possible to form charge/discharge units by integrating, by one each, the charge/discharge means and the first and/or second charge/discharge probes each connected to each of the charge/ discharge means, and form on each one of the substrates a plurality of the charge/discharge units that are corresponding to the secondary batteries in each of the lines.

The contact function-equipped multichannel charge/discharge power supply according to the present invention, it is preferred that each of the substrates be provided further with the first and/or second voltage-measurement probes corresponding to the secondary batteries arranged in the lines in the one direction.

The contact function-equipped multichannel charge/discharge power supply according to the present invention, it is preferred that a connecting terminal to be attached to a socket disposed in a fixed state be provided at an end portion of each of the substrates. This makes replacement and maintenance of the substrates easier.

The contact function-equipped multichannel charge/discharge power supply according to the present invention, it is preferred that each of the charge/discharge means be thermally insulated from the first and second charge/discharge probes corresponding thereto and from the first and second voltage-measurement probes corresponding thereto. This makes it possible to reduce heat interferences between the secondary batteries and the charge/discharge means.

The contact function-equipped multichannel charge/discharge power supply according to the present invention, it is preferred that the first and second charge/discharge probes and the first and second voltage-measurement probes be disposed above the secondary batteries.

The contact function-equipped multichannel charge/discharge power supply according to the present invention, it is also possible that the first charge/discharge probes and the first voltage-measurement probes are disposed above the secondary batteries, while the second charge/discharge probes and the second voltage-measurement probes are disposed below the secondary batteries.

Here, it is recommended that the first and second charge/discharge probes and the first and second voltage-measurement probes be each positioned at a central portion, in plan view, of a corresponding one of the secondary batteries.

The contact function-equipped multichannel charge/discharge power supply according to the present invention, it is preferred that the substrates next to one another be arranged with gaps, and a fan be provided on one side of each of the gaps.

The contact function-equipped multichannel charge/discharge power supply according to the present invention, it is preferred that output of the first and second voltage-measurement probes be connected to a control unit disposed outside and inspecting charge/discharge characteristics.

The contact function-equipped multichannel charge/discharge power supply according to the present invention, it is preferred that the substrates be printed circuit boards or flexible circuit boards. Incidentally, each of the secondary batteries is positioned by a holder.

Advantageous Effects of Invention

Since the contact function-equipped multichannel charge/discharge power supply according to the present invention includes the substrates provided along the secondary batteries arranged in lines in one direction and the substrates have the charge/discharge means corresponding to the secondary batteries arranged in the lines in the one direction, the cables conventionally used for connecting the power supply unit and the contact unit can be eliminated or extremely shortened.

This makes it possible to obtain good test results, resolve the adverse effects caused by using the cables, and additionally, make the apparatus structure more compact.

Additionally, in a case where the charge/discharge means are thermally insulated from the first and second charge/discharge probes and the first and second voltage-measurement probes, the interferences of heat energy generated by the charge/discharge means with the secondary batteries, and its reverse phenomena can be suppressed, and moreover, can be prevented. This makes it possible to decrease, and moreover eliminate, influences to the test results. Incidentally, it is preferred that the charge/discharge means, the first and second charge/discharge probes, the first and second voltage-measurement probes, and the secondary batteries be cooled with a fan/fans.

DESCRIPTION OF EMBODIMENTS

Embodiments of the present invention will be described next with reference to the accompanying drawings to provide an understanding of the present invention.

Figure 1:
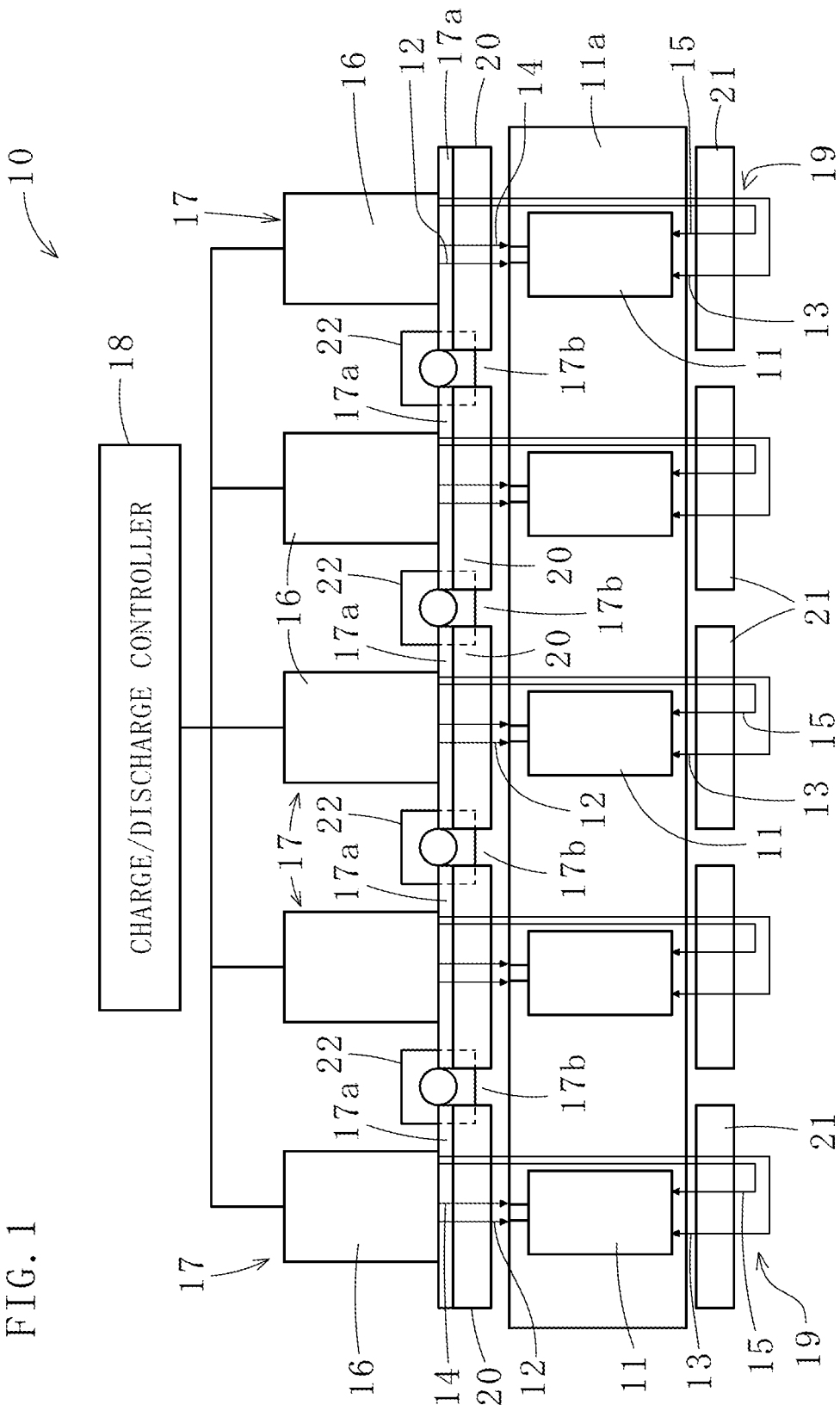
FIG. 1 is an explanatory drawing illustrating a contact function-equipped multichannel charge/discharge power supply according to a first embodiment of the present invention.

As shown in FIG. 1, a contact function-equipped multichannel charge/discharge power supply (i.e. a charge/discharge test apparatus for secondary batteries) 10 according to the first embodiment of the present invention includes: first charge/discharge probes 12 and first voltage-measurement probes 14 connected to positive electrodes of, e.g., a plurality of cylindrical secondary batteries 11; second charge/discharge probes 13 and second voltage-measurement probes 15 connected to negative electrodes of the secondary batteries 11; and charge/discharge means 16 each provided for each of the secondary batteries 11 and each connected to a pair of the first and second charge/discharge probes 12, 13. With the contact function-equipped charge/discharge power supply 10, good test results can be obtained, the adverse effects caused by using the cables can be resolved, and additionally, the apparatus structure can be made more compact. More detailed explanations will be provided below.

The contact function-equipped charge/discharge power supply (hereinafter, also referred as just to "the charge/discharge power supply") 10 includes a casing (not shown in the figure) that is capable of accommodating a plurality of trays 11a (one of the trays 11a is shown in FIG. 1), in each of the trays 11a a plurality of the secondary batteries 11 are arranged in lines, in a manner where the trays 11a are placed at intervals in the height direction (where the trays 11a are placed in a plurality of stages in the height direction).

An open/close door is provided on the front side of the casing, and the trays 11a can be carried into and out from the casing by opening and closing the door. Note that although the carrying into/out of the trays 11a is done by sliding the trays 11a using, e.g., a carrying means, the present invention is not limited to it. Additionally, the casing may be an open type one without the open/close door.

Each of the trays 11a is a frame body that has a right-angled-quadrilateral (rectangular or square) shape in plan view (see FIG. 2), and also has openings at its top and bottom. Each of the trays 11a accommodates and holds a plurality of the secondary batteries 11 in a manner where the secondary batteries 11 are arranged longitudinally and laterally (in the depth and lateral directions of FIG. 1, i.e., in a matrix state with columns and rows) at regular intervals (predetermined intervals). More concretely, with each of the trays 11a, holding frames (holders) for holding and positioning the secondary batteries 11 are provided longitudinally and laterally such that gaps are formed between the secondary batteries 11 next to one another. (The number of the holding frames is equal to the maximum number of the secondary batteries 11 that can be accommodated.)

In FIG. 1, one of the lines of the secondary batteries 11 in the depth direction (one line in one direction) is set as a column, and a state where a plurality of the columns of the secondary batteries 11 are arranged in the lateral direction is illustrated (only one row) (it is also the case in FIG. 3 described below).

Although ways to arrange the secondary batteries in the trays 11a are not particularly limited, the secondary batteries can be arranged by a plural number each, e.g., 16 each, at intervals in the depth and lateral directions of FIG. 1 (in this case, 16×16=256, 256 of the secondary batteries are arranged).

Above each of the trays 11a inside the casing, a plurality of charge/discharge units 17 each provided for each of the secondary batteries 11 are disposed.

Each of the charge/discharge units 17 is placed over a corresponding one of the secondary batteries 11, and is formed by integrating: one of the charge/discharge means 16 that are CC-CV (Constant Current-Constant Voltage) type ones; one each of the first charge/discharge probes 12 and the first voltage-measurement probes 14 both connected to the one of the charge/discharge means 16 and connectable to the positive electrode of the corresponding one of the secondary batteries 11. Therefore, the charge/discharge units 17 (each of which has the charge/discharge means 16, the first charge/discharge probe 12, and the first voltage-measurement probe 14) exist by the number corresponding to the maximum number of the secondary batteries 11 accommodated by one of the trays 11a (i.e., the number of the charge/discharge units 17 is the same as the number of the secondary batteries 11 that each of the trays 11a can accommodate).

Incidentally, the charge/discharge units 17 are attached to below-described substrates 17a so as to be un-detachable from the substrates 17a; however, they may be attached so as to be detachable and re-attachable.

Furthermore, the first charge/discharge probe 12 and the first voltage-measurement probe 14 in each of the charge/discharge units 17 are separately independently provided; however, they may be configured (made common) as one probe.

Figure 2:
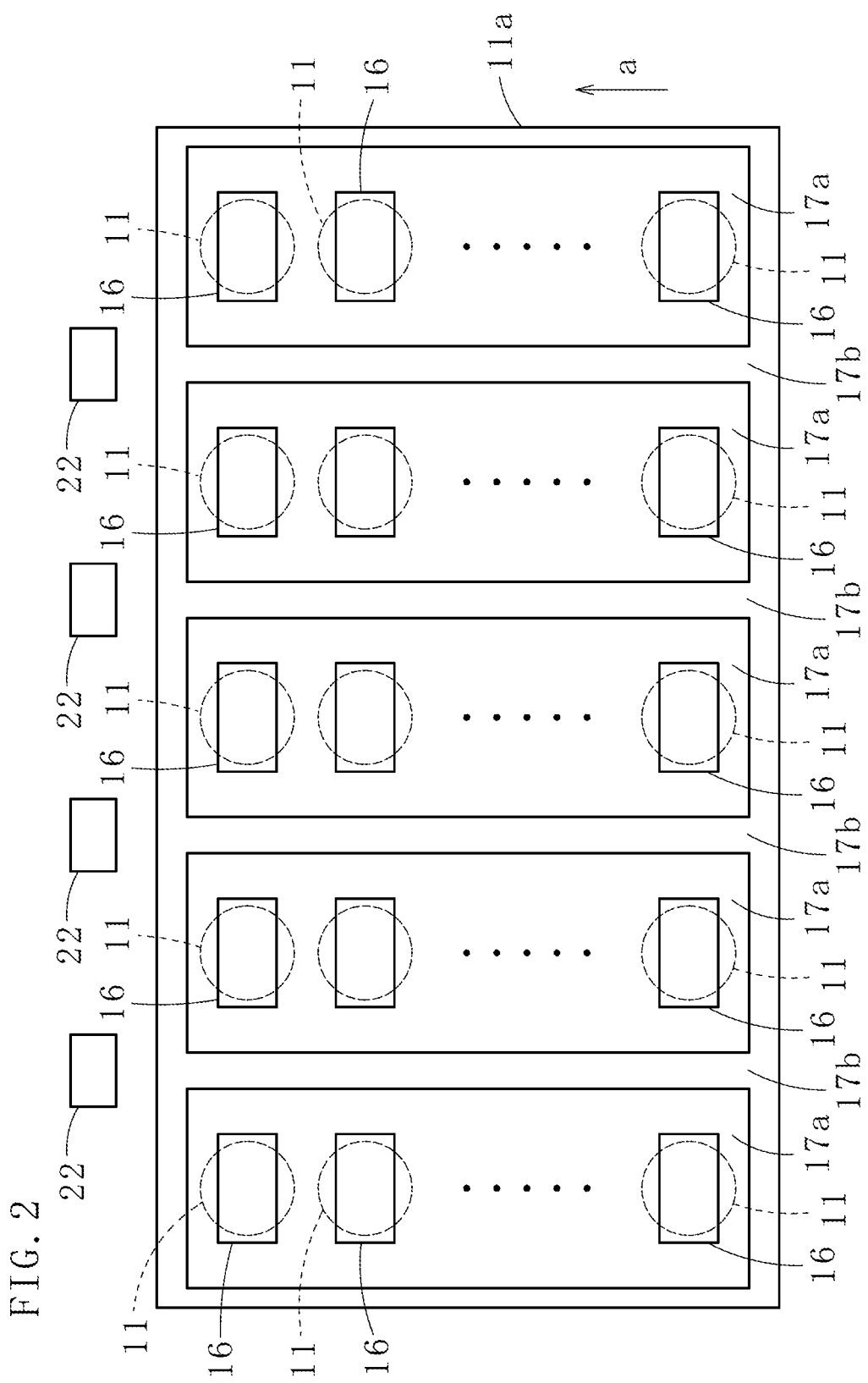
FIG. 2 is a plan view of FIG. 1.

The charge/discharge units 17 are arranged in a plurality of columns so as to be corresponding to positions of the secondary batteries 11 arranged in a plurality of the columns (an arrow "a" in FIG. 2 shows the direction of the columns). A plurality of the charge/discharge units 17 (charge/discharge means 16) composing each of the columns (and corresponding to the secondary batteries 11 in each of the columns) are formed on a substrate 17a. That is, the secondary batteries 11 are arranged in lines in one direction, the substrates 17a are each provided along the secondary batteries 11 arranged in each of the lines, and each of the substrates 17a has the charge/discharge means 16, the first charge/discharge probes 12, and the first voltage-measurement probes 14, all of which are corresponding to the secondary batteries 11 arranged in each of the lines in the one direction. Therefore, a plurality of the substrates 17a are disposed with gaps 17b in the lateral direction.

The substrates 17a are printed circuit boards; however, they may be flexible circuit boards, and this makes it possible to absorb slight discrepancies (deviations) between pitches (gaps) of the charge/discharge units 17 and that of the secondary batteries 11. Alternatively, those discrepancies in the pitches can be dissolved also by connecting with connecters the charge/discharge means 16, the first charge/discharge probe 12, and the first voltage-measurement probe 14 in each of the charge/discharge units 17.

On each of the substrates 17a, electric wiring for transmitting and receiving of electric signals between each of the charge/discharge means 16 and a charge/discharge controller (an example of a control unit) 18 disposed outside is formed. Incidentally, the charge/discharge controller 18 is a computer disposed outside the casing, and manages charging currents, charging voltages, discharging currents, and discharging voltages for each of the secondary batteries 11.

A connecting terminal (not shown in the figure) is formed at an end portion (on the deeper side of FIG. 1) of each of the substrates 17a. By attaching the connecting terminal to a socket (not shown in the figure) disposed in a fixed state on the deeper side (back side) inside the casing, the transmitting and receiving the electric signals between the charge/discharge means 16 and the charge/discharge controller 18 is made to be possible.

Below each of the trays 11a inside the casing, contact units 19 are disposed.

The contact units 19 are each placed under each of the secondary batteries 11, and each of the contact units 19 is formed by integrating one each of: the second charge/discharge probes 13 and the second voltage-measurement probes 15 both connectable to the negative electrode of a corresponding one of the secondary batteries 11. Therefore, the contact units 19 (each of which has the second charge/discharge probe 13 and the second voltage-measurement probe 15) exist by the number corresponding to the maximum number of the secondary batteries 11 accommodated by one of the trays 11a (i.e., the number of the contact units 19 is the same as the number of the secondary batteries 11 that each of the trays 11a can accommodate).

Incidentally, the second charge/discharge probe 13 and the second voltage-measurement probe 15 in each of the contact units 19 are separately independently provided; however, they may be configured (made common) as one probe.

The trays 11a for accommodating the secondary batteries 11, and the above-described contact units 19 can be each moved up and down with an independent lifting up/down means (not shown in the figure).

This makes it possible to connect (attach) and detach the first charge/discharge probes 12 and the first voltage-measurement probes 14 to/from the positive electrodes of the secondary batteries 11, and also to connect (attach) and detach the second charge/discharge probes 13 and the second voltage-measurement probes 15 to/from the negative electrodes of the secondary batteries 11.

Additionally, by positioning each of the first and second charge/discharge probes 12, 13 and each of the first and second voltage-measurement probes 14, 15 at a central portion of a corresponding one of the secondary batteries 11 in plan view, the probes can be connected to the electrodes with no fail even if some deviations occur in relative positions among the positive and negative electrodes of the secondary batteries 11, the first and second charge/discharge probes 12, 13, and the first and second voltage-measurement probes 14, 15. Note that it is preferred in this embodiment that the substrates 17a provided with the charge/discharge units 17 each formed, so as to be corresponding to the secondary batteries 11 arranged in each of the lines in the one direction, by integrating one each of: the first charge/discharge probes 12; the first voltage-measurement probes 14; and the charge/discharge means 16, be disposed in a fixed state. However, the substrates 17a with the charge/discharge units 17 formed may be made to be movable up and down.

For the first charge/discharge probes 12 and the first voltage-measurement probes 14, an insulator 20 made from a resin or else is provided for each of the columns such that lower portions of the probes 12, 14 having penetrated the insulator 20 protrude toward the positive electrodes of the secondary batteries 11.

Also, for the second charge/discharge probes 13 and the second voltage-measurement probes 15, an insulator 21 made from a resin or else is provided for each of the columns such that upper portions of the probes 13, 15 having penetrated the insulator 21 protrude toward the negative electrodes of the secondary batteries 11. Incidentally, the insulators 21 may not be provided.

Since these insulators 20, 21 thermally insulate the charge/discharge means 16 from the first and second charge/discharge probes 12, 13 and the first and second voltage-measurement probes 14, 15, it is possible to suppress or moreover prevent heat energy generated by the charge/discharge means 16 from interfering with the secondary batteries 11.

Also, by providing a fan 22 on the deeper side (one side) of each of the gaps 17b between the substrates 17a next to one another, the heat energy can be suppressed or moreover prevented from interfering with the secondary batteries 11. Note that the fan 22 may not necessarily be provided on the deeper side of every one of the gaps 17b, but may be provided on the deeper side of only some (or one) of the gaps 17b.

Furthermore, since the secondary batteries 11 next to one another have the gaps 17b therebetween, winds from the fan(s) 22 can pass through the gaps 17b.

When using the charge/discharge power supply 10, the first charge/discharge probes 12 and the first voltage-measurement probes 14 are brought into contact to the positive electrodes of the secondary batteries 11, and the second charge/discharge probes 13 and the second voltage-measurement probes 15 are brought into contact to the negative electrodes of the secondary batteries 11.

Subsequently, the charge/discharge controller 18 charges the secondary batteries 11 by applying a voltage power supply supplied from required power supplies to the first and second charge/discharge probes 12, 13 connected to the secondary batteries 11, and/or discharges electric charge having already been charged in the secondary batteries 11 through the first and second charge/discharge probes 12, 13. Also, when charging/discharging of the secondary batteries 11, the charge/discharge controller 18 measures the amount of electric currents flowing through the first and second voltage-measurement probes 14, 15 and inter-terminal voltages of the secondary batteries 11, that is, the electric voltages between the first and second voltage-measurement probes 14, 15.

Here, the charge/discharge controller 18 can regenerate the discharged currents output from the secondary batteries 11 and prepare for the next supply of the charging currents.

Further, charging/discharging patterns can be changed according to input signals input from, e.g., a control panel provided on the front surface of the casing and also according to programs of the charge/discharge controller 18.

The charge/discharge controller 18 can also perform evaluations of the secondary batteries 11, that is, inspections of charge/discharge characteristics by taking data of during the above-described charging/discharging such as current values, voltage values, charging/discharging time or else, from output of the first and second voltage-measurement probes 14, 15.

As described above, in the charge/discharge power supply 10, the charge/discharge means 16, the first charge/discharge probes 12, and the first voltage-measurement probes 14 are integrated by one each. Thus, the cables conventionally used can be eliminated. Also, especially regarding the secondary batteries 11 and the second charge/discharge probes 13 (also the second voltage-measurement probes 15 in some cases), the cables conventionally used can be shortened.

This makes it possible to obtain good test results, resolve the adverse effects caused by using longer cables, and additionally, make the apparatus structure more compact.

A method for performing charge/discharge tests of the secondary batteries using the contact function-equipped multichannel charge/discharge power supply 10 according to the first embodiment of the present invention will be explained next, with reference to FIG. 1.

First, in a state where a plurality of the secondary batteries 11 to be test objects are arranged in the trays 11a, each of the trays 11a is carried into a region between the charge/discharge units 17 and the contact units 19 of the charge/discharge power supply 10 and moved up. This makes a plurality of the first charge/discharge probes 12 and a plurality of the first voltage-measurement probes 14 provided with the substrates 17a disposed above the trays 11a be connected to the positive electrodes of the secondary batteries 11, and this also makes a plurality of the second charge/discharge probes 13 and a plurality of the second voltage-measurement probes 15 composing the contact units 19 disposed below the trays 11a be oppositely placed with a gap with respect to the negative electrodes of the secondary batteries 11.

Subsequently, by moving up the contact units 19 (lower fixtures), the second charge/discharge probes 13 and the second voltage-measurement probes 15 are brought into contact with (connected to) the negative electrodes of the secondary batteries 11 under a condition where the first charge/discharge probes 12 and the first voltage-measurement probes 14 are connected to the positive electrodes of the secondary batteries 11.

Then, the secondary batteries 11 are charged and discharged repeatedly to be activated, and the inspections of the charge/discharge characteristics are performed.

After having finished the charge/discharge tests of the secondary batteries 11, by moving down the contact units 19 (alternatively by moving up the substrates 17a), the first charge/discharge probes 12 and the first voltage-measurement probes 14 are detached from the positive electrodes of the secondary batteries 11, while the second charge/discharge probes 13 and the second voltage-measurement probes 15 are detached from the negative electrodes of the secondary batteries 11.

Then, each of the trays 11a is pulled out from the region between the charge/discharge units 17 and the contact units 19 to be carried out from the charge/discharge power supply 10.

After that, the above-described procedures, that is: carrying the trays 11a, in which the secondary batteries 11 to be newly inspected are arranged, into the casing of the charge/discharge power supply 10; and carrying the trays 11a out from the casing of the charge/discharge power supply 10 after finishing the charge/discharge tests, are repeatedly performed.

Next, a contact function-equipped multichannel charge/discharge power supply (i.e. a charge/discharge test apparatus for secondary batteries) 30 according to the second embodiment of the present invention will be explained, with reference to FIG. 3 and FIG. 4. Since the contact function-equipped multichannel charge/discharge power supply 30 has a structure that is almost the same as that of the contact function-equipped multichannel charge/discharge power supply 10 according to the first embodiment of the present invention, identical reference signs will be given to common parts, and regarding these common parts, detailed explanations will be omitted.

The contact function-equipped multichannel charge/discharge power supply (hereinafter, also referred as just to "the charge/discharge power supply") 30 includes: first charge/discharge probes 12 and first voltage-measurement probes 14 connected to positive electrodes of a plurality of prismatic secondary batteries 31; second charge/discharge probes 13 and second voltage-measurement probes 15 connected to negative electrodes of the secondary batteries 31; and charge/discharge means 16 each provided for each of the secondary batteries 31 and each connected to a pair of the first and second charge/discharge probes 12, 13.

Figure 3:
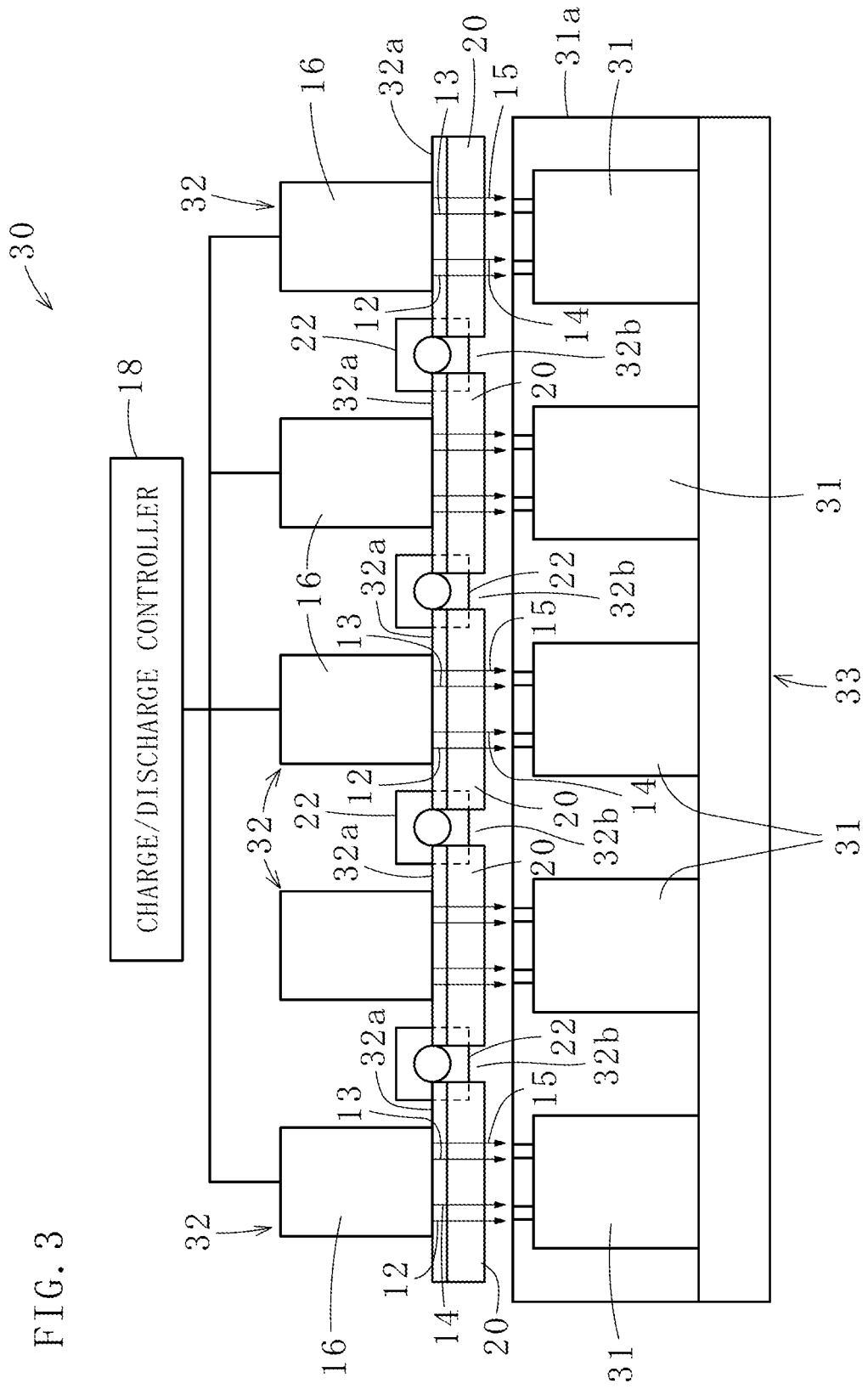
FIG. 3 is an explanatory drawing illustrating a contact function-equipped multichannel charge/discharge power supply according to a second embodiment of the present invention.

The charge/discharge power supply 30 includes a casing (not shown in the figure) that is capable of accommodating a plurality of trays 31a (one of the trays 31a is shown in FIG. 3), in each of the trays 31a a plurality of the secondary batteries 31 are arranged, in a manner where the trays 31a are placed at intervals in the height direction. By means of an open/close door provided on the front side of the casing, the trays 31a are carried into and out. However, the casing may be an open type one without the open/close door. Each of the trays 31a is a frame body that has a right-angled-quadrilateral (rectangular or square) shape in plan view (see FIG. 4), and also has openings at its top and bottom. Each of the trays 31a accommodates and holds a plurality of the secondary batteries 31 in a manner where the secondary batteries 31 are arranged longitudinally and laterally (in the depth and lateral directions of FIG. 3 in the tray 31a at regular intervals (predetermined intervals). More concretely, with each of the trays 31a, holding frames (holders) for holding and positioning the secondary batteries 31 are provided longitudinally and laterally such that gaps are formed between the secondary batteries 31 next to one another. (The number of the holding frames is equal to the maximum number of the secondary batteries 31 that can be accommodated.)

Above each of the trays 31a inside the casing, a plurality of charge/discharge units 32 each provided for each of the secondary batteries 31 are disposed.

Each of the charge/discharge units 32 is placed over a corresponding one of the secondary batteries 31, and is formed by integrating: one of the charge/discharge means 16; one each of the first charge/discharge probes 12 and the first voltage-measurement probes 14 both connected to the one of the charge/discharge means 16 and connectable to the positive electrode of the corresponding one of the secondary batteries 31; and one each of the second charge/discharge probes 13 and the second voltage-measurement probes 15 both connected to the one of the charge/discharge means 16 and connectable to the negative electrode of the corresponding one of the secondary batteries 31. (The first and second charge/discharge probes 12, 13 and the first and second voltage-measurement probes 14, 15 are disposed above the secondary batteries 31.) Therefore, the charge/discharge units 32 (each of which has the charge/discharge means 16, the first and second charge/discharge probes 12, 13, and the first and second voltage-measurement probes 14, 15) exist by the number corresponding to the maximum number of the secondary batteries 31 accommodated by one of the trays 31a (i.e., the number of the charge/discharge units 32 is the same as the number of the secondary batteries 31 that each of the trays 31a can accommodate).

Figure 4:
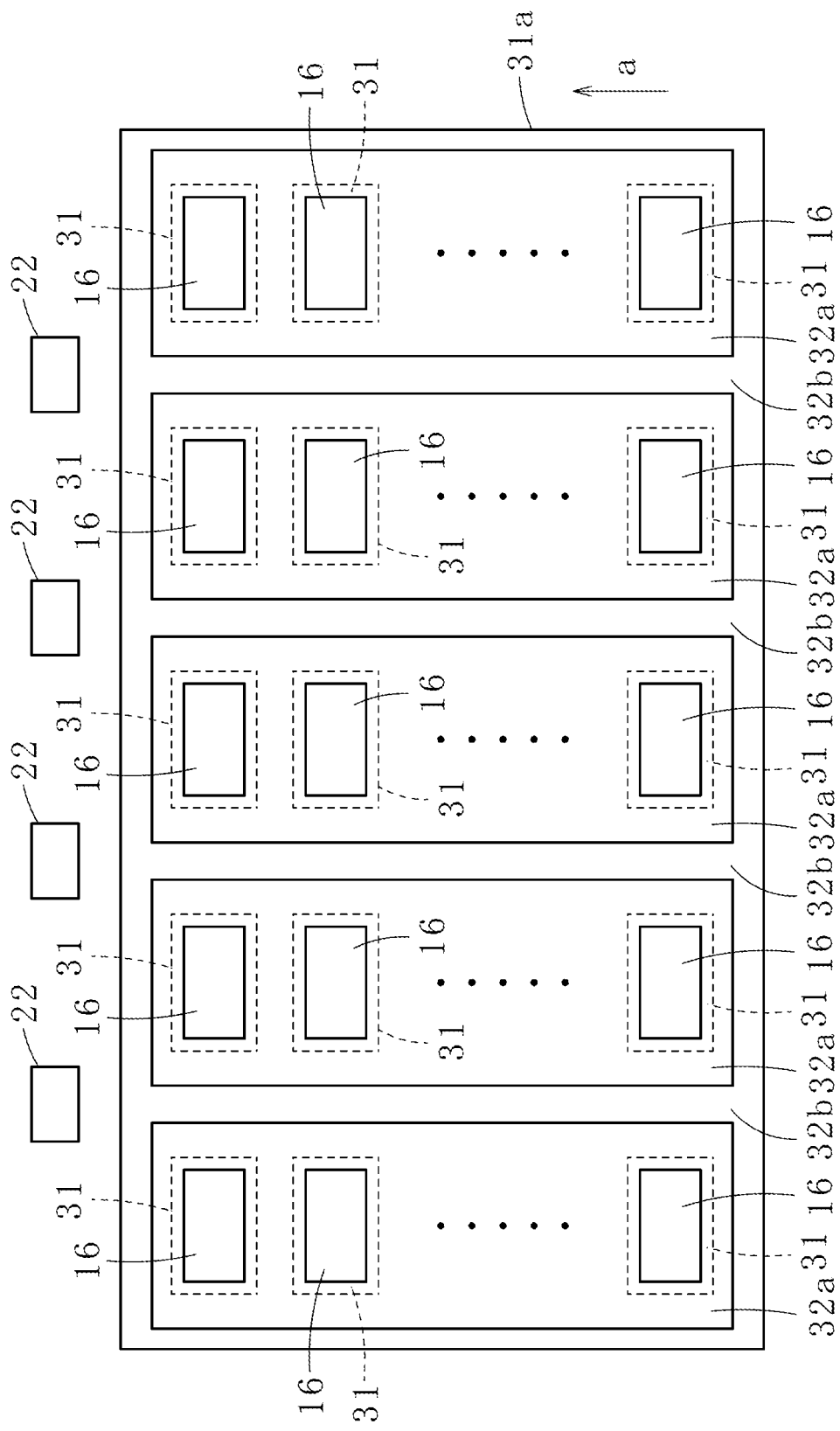
FIG. 4 is a plan view of FIG. 3.
Figure 5:
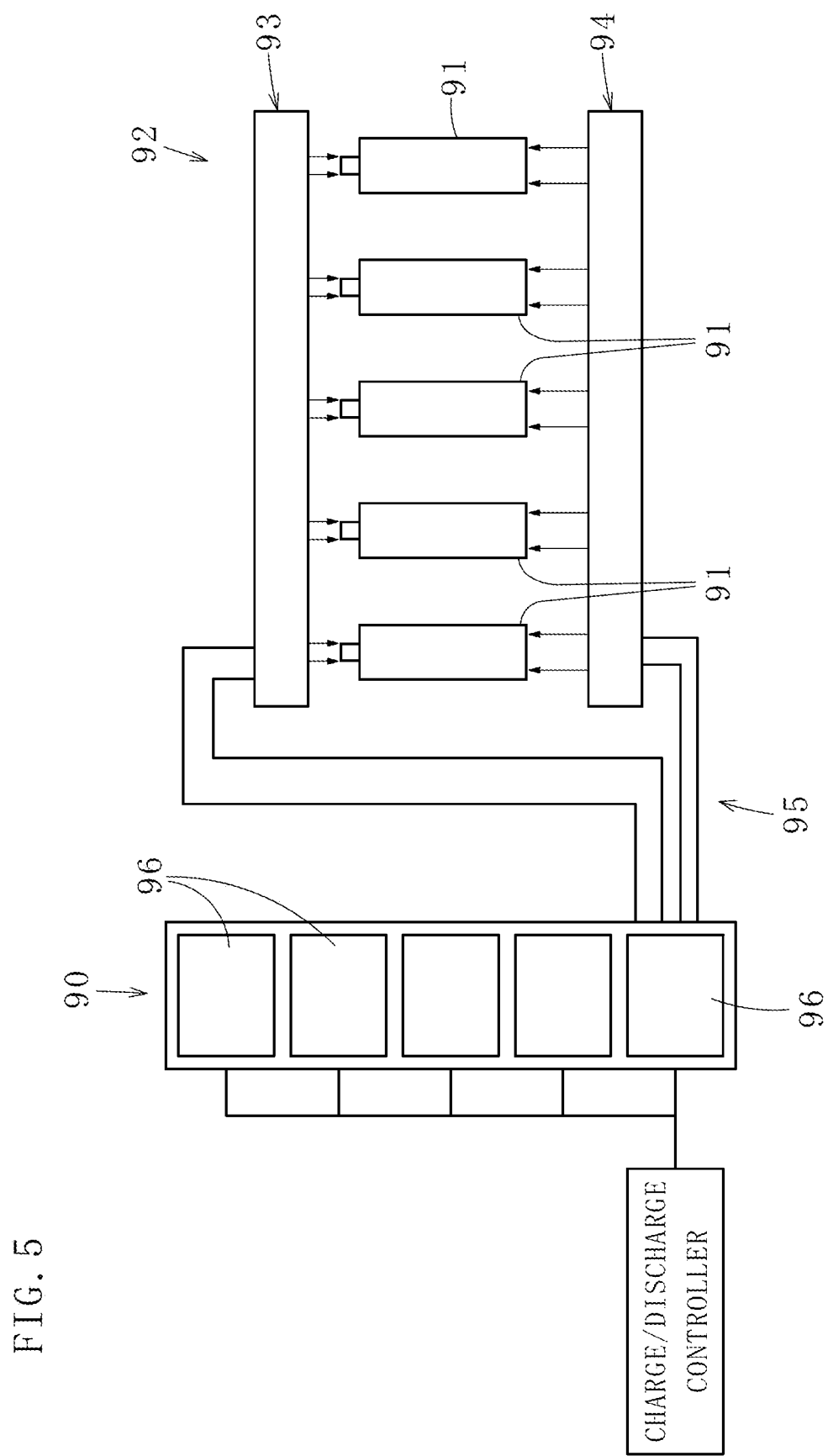
FIG. 5 is an explanatory drawing illustrating a charge/discharge evaluation apparatus for secondary batteries according to a conventional example.

The charge/discharge units 32 are arranged in a plurality of columns so as to be corresponding to positions of the secondary batteries 31 arranged in a plurality of the columns (an arrow "a" in FIG. 4 shows the direction of the columns). A plurality of the charge/discharge units 32 (charge/discharge means 16) composing each of the columns (and corresponding to the secondary batteries 31 in each of the columns) are formed on a substrate 32a. That is, the secondary batteries 31 are arranged in lines in one direction, the substrates 32a are each provided along the secondary batteries 31 arranged in each of the lines, and each of the substrates 32a has the charge/discharge means 16, the first and second charge/discharge probes 12, 13, and the first and second voltage-measurement probes 14, 15, all of which are corresponding to the secondary batteries 31 arranged in each of the lines in the one direction. Therefore, a plurality of the substrates 32a are disposed with gaps 32b in the lateral direction.

The substrates 32a have a structure that is basically the same as that of the substrates 17a used in the above-mentioned first embodiment of the present invention, and on each of the substrates 32a, electric wiring for transmitting and receiving of electric signals between each of the charge/discharge means 16 and a charge/discharge controller 18 is formed.

Below each of the trays 31a inside the casing, a stage unit for lifting up/down 33 that can be moved up/down with a lifting up/down means (not shown in the figure) is disposed. By means of the stage units for lifting up/down 33, the trays 31a are moved up and down.

This makes it possible to connect (attach) and detach the first charge/discharge probes 12 and the first voltage-measurement probes 14 to/from the positive electrodes of the secondary batteries 31, and the second charge/discharge probes 13 and the second voltage-measurement probes 15 to/from the negative electrodes of the secondary batteries 31.

As described above, in the charge/discharge power supply 30, the charge/discharge units 32, which are each formed by integrating one each of: the charge/discharge means 16; the first and second charge/discharge probes 12, 13; and the first and second voltage-measurement probes 14, 15, are provided on each of the substrates 32a so as to be corresponding to the secondary batteries 11 in each of the columns. Therefore, the cables conventionally used can be partially omitted.

This makes it possible to obtain good test results, resolve the adverse effects caused by using the cables, and additionally, make the apparatus structure more compact.

The present invention has been described above with reference to the embodiments. However, the present invention is not limited to any of the structures described in the above embodiments, and includes other embodiments and modifications conceivable within the scope of the matters described in the scope of the claims. For example, cases where a part/parts of or entirety of the embodiments and modifications described above are combined to configure a contact function-equipped multichannel charge/discharge power supply according to the present invention are also included within the scope of rights of the present invention.

In the above embodiments, lithium ion batteries are used as the secondary batteries. However, not limited to this, e.g., other secondary batteries such as nickel hydrogen batteries, capacitors such as electric dual layer capacitors, or else may be used.

Also, although in one of the above embodiments the secondary batteries are disposed such that the positive electrodes come to upside while the negative electrodes come to downside, it may be opposite (the positive electrodes come to downside while the negative electrodes come to upside). In this opposite case, the charge/discharge units placed above the secondary batteries come to be each formed by integrating: one of the charge/discharge means; and one each of the second charge/discharge probes and the second voltage-measurement probes both connected to the one of the charge/discharge means and connectable to the negative electrode of a corresponding one of the secondary batteries.

Incidentally, the charge/discharge units may be placed below the secondary batteries.

Additionally, in the above embodiments the cases where the charge/discharge means, the first charge/discharge probes, and the second voltage-measurement probes (and moreover, the second charge/discharge probes and the second voltage-measurement probes) are integrated by one each, and provided on each of the substrates, are described. However, the first and second voltage-measurement probes may not necessarily be provided on each of the substrates (i.e., the first and/or second voltage-measurement probes may be provided on each of the substrates). In this case, it is also possible that separately-independent wiring or substrates be provided.

INDUSTRIAL APPLICABILITY

Since the contact function-equipped multichannel charge/discharge power supply according to the present invention enables to eliminate or extremely shorten the cables conventionally used for connecting the power supply unit and the contact unit, good test results can be obtained, the adverse effects caused by using the cables can be resolved, and additionally, the apparatus structure can be made more compact. This makes it possible to respond the rapidly increasing demand for the secondary batteries used for IT appliances such as smart-phones or else and electric cars, and thereby contribute to the development of industry.

REFERENCE SIGNS LIST

10: contact function-equipped multichannel charge/discharge power supply, 11: secondary battery, 12: first charge/discharge probe, 13: second charge/discharge probe, 14: first voltage-measurement probe, 15: second voltage-measurement probe, 16: charge/discharge means, 17: charge/discharge unit, 18: charge/discharge controller (control unit), 19: contact unit, 20, 21: insulator, 30: contact function-equipped multichannel charge/discharge power supply, 31: secondary battery, 32: charge/discharge unit, 33: stage unit for lifting up/down

The invention claimed is:

1. A contact function-equipped multichannel charge/discharge power supply for performing charge/discharge testing of secondary batteries, the contact function-equipped multichannel charge/discharge power supply comprising:
a casing, into which a plurality of the secondary batteries are carried in a tray in a state where the secondary batteries are arranged longitudinally and laterally in lines at regular intervals in a plan view of the tray;
first and second charge/discharge probes respectively connected to positive and negative electrodes of the secondary batteries and first and second voltage-measurement probes respectively connected to the positive and negative electrodes of the secondary batteries;
charge/discharge means each provided for each of the secondary batteries, each of the charge/discharge means being connected to a pair of the first and second charge/discharge probes;
substrates, each of the substrates extending longitudinally in the plan view of the tray for each line of the secondary batteries arranged longitudinally in the plan view of the tray, the substrates being arranged side by side laterally in the plan view of the tray, with gaps between each side by side pair of the substrates;
charge/discharge units formed by integrating, by one each, the charge/discharge means and the first and/or second charge/discharge probes each connected to each of the charge/discharge means, the charge/discharge units being arranged side by side longitudinally in the plan view of the tray on each of the substrates, with each of the charge/discharge units corresponding to each of the secondary batteries arranged longitudinally in the plan view of the tray; and
fans provided on one side of each of the gaps, each of the fans being provided at one end of each of the gaps extending longitudinally in the plan view of the tray, the fans suppressing heat energy generated by each of the charge/discharge means from interfering with the charge/discharge testing of the secondary batteries.

2. The contact function-equipped multichannel charge/discharge power supply according to claim 1, wherein
the positive and negative electrodes of each of the secondary batteries are provided on an upper side of the secondary battery, and
the first and second charge/discharge probes are disposed above the secondary batteries, each integrated together with a corresponding one of the charge/discharge means, and provided on the substrates.

3. The contact function-equipped multichannel charge/discharge power supply according to claim 1, wherein each of the charge/discharge means is thermally insulated from the first and second charge/discharge probes corresponding thereto and from the first and second voltage-measurement probes corresponding thereto.

4. The contact function-equipped multichannel charge/discharge power supply according to claim 2, wherein each of the charge/discharge means is thermally insulated from the first and second charge/discharge probes corresponding thereto and from the first and second voltage-measurement probes corresponding thereto.

* * * * *